United States Patent
Weiss et al.

(10) Patent No.: US 11,774,495 B2
(45) Date of Patent: Oct. 3, 2023

(54) CAPACITIVE TEST NEEDLE FOR MEASURING ELECTRICALLY CONDUCTIVE LAYERS IN PRINTED CIRCUIT BOARD HOLES

(71) Applicant: Xcerra Corporation, Norwood, MA (US)

(72) Inventors: Stefan Weiss, Wertheim (DE); Oleh Yuschuk, Wertheim-Reicholzheim (DE); Christian Weindel, Ölbronn-Dürrn (DE)

(73) Assignee: ATG LUTHER & MAELZER GMBH, Wertheim/Reicholzhei (DE)

( * ) Notice: Subject to any disclaimer, the term of this patent is extended or adjusted under 35 U.S.C. 154(b) by 148 days.

(21) Appl. No.: 16/960,434

(22) PCT Filed: Jan. 17, 2019

(86) PCT No.: PCT/EP2019/051148
§ 371 (c)(1),
(2) Date: Jul. 7, 2020

(87) PCT Pub. No.: WO2019/141777
PCT Pub. Date: Jul. 25, 2019

(65) Prior Publication Data
US 2020/0348359 A1 Nov. 5, 2020

(30) Foreign Application Priority Data

Jan. 18, 2018 (DE) .................. 10 2018 101 031.1
Oct. 16, 2018 (DE) .................. 10 2018 125 666.3

(51) Int. Cl.
*G01R 31/312* (2006.01)
*G01R 31/28* (2006.01)
(Continued)

(52) U.S. Cl.
CPC ....... *G01R 31/312* (2013.01); *G01R 1/06738* (2013.01); *G01R 1/07* (2013.01); *G01R 31/2813* (2013.01)

(58) Field of Classification Search
CPC .... G01R 31/312; G01R 1/06738; G01R 1/07; G01R 31/2813; G01R 1/07392;
(Continued)

(56) References Cited

U.S. PATENT DOCUMENTS 3,840,802 A 10/1974 Anthony
4,060,760 A 11/1977 Rogachev et al.
(Continued)

FOREIGN PATENT DOCUMENTS

CN 1650181 A 8/2005
CN 102043121 A 5/2011
(Continued)

OTHER PUBLICATIONS

International Preliminary Report on Patentability dated Jul. 30, 2020, from International Application No. PCT/EP2019/051148, filed on Jan. 17, 2019. 18pages.
(Continued)

*Primary Examiner* — Lee E Rodak
(74) *Attorney, Agent, or Firm* — HoustonHogle LLP

(57) ABSTRACT

The invention relates to a test needle for measuring electrically conductive layers in holes of printed circuit boards, as well as to a test probe equipped with such a test needle and to a flying probe tester for testing printed circuit boards equipped with such a test needle or such a test probe.

Figure 1:
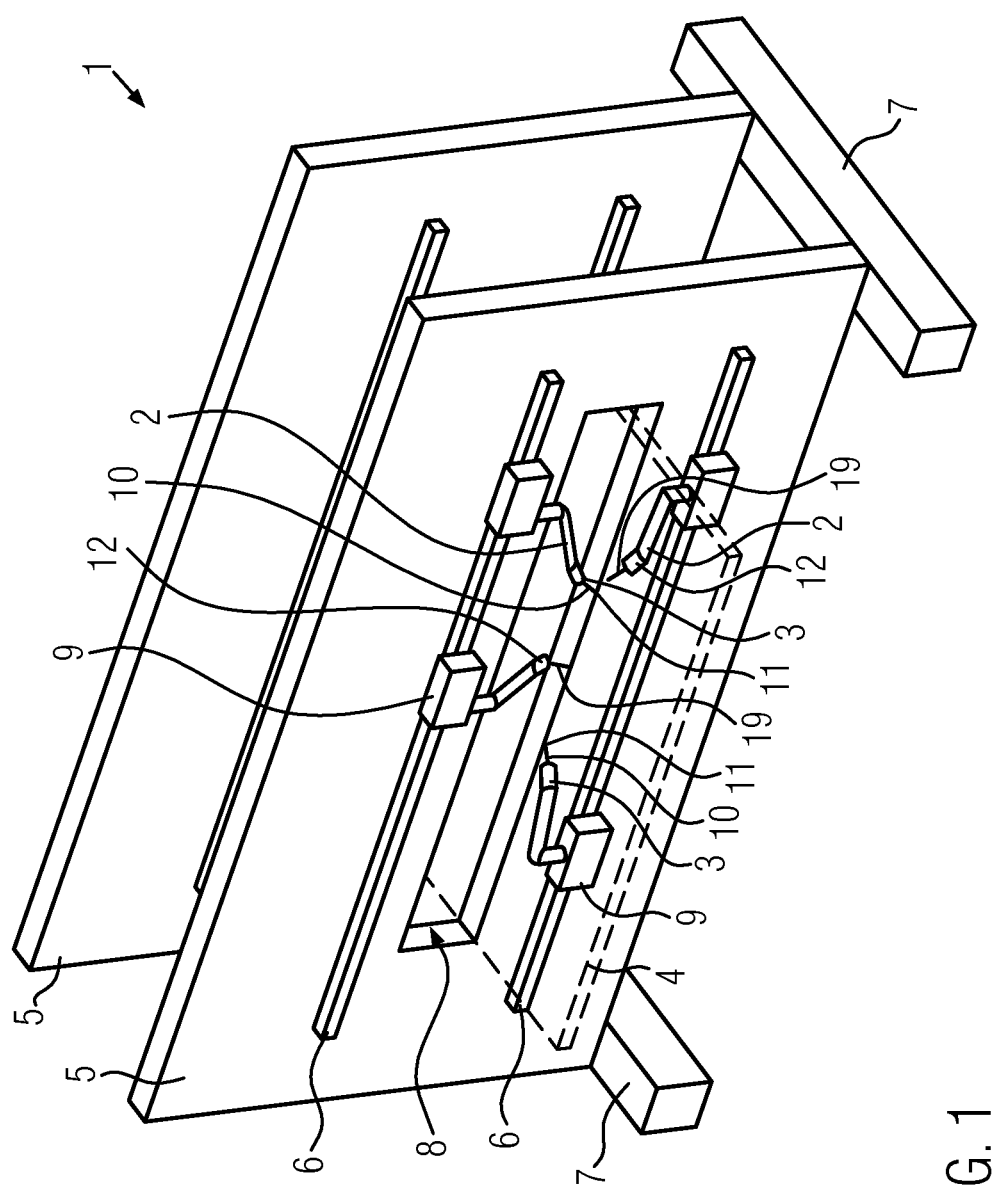

The test needle has a capacitive measuring body, which is connected via a cable to a capacitive measuring device. The cable is shielded so that only the capacitive measuring body can form a capacitive coupling with other electrically con-
(Continued)

ductive bodies. This makes it possible to determine this capacitive coupling with a high local resolution.

8 Claims, 6 Drawing Sheets

(51) Int. Cl.
*G01R 1/067* (2006.01)
*G01R 1/07* (2006.01)

(58) Field of Classification Search
CPC ............ G01R 1/06733; G01R 1/06722; G01R 1/06761; G01R 23/02; G01R 27/2605; G01R 31/2808; G01R 31/2886; G01B 21/22; G01L 5/0057
See application file for complete search history.

(56) References Cited

U.S. PATENT DOCUMENTS

| | | | | |
|---|---|---|---|---|
| 4,072,895 | A * | 2/1978 | Rogachev | G01R 31/2805 324/237 |
| 5,274,336 | A * | 12/1993 | Crook | G01R 1/07 324/755.02 |
| 7,669,321 | B1 | 3/2010 | Levy et al. | |
| 8,431,834 | B2 | 4/2013 | Twardy et al. | |
| 9,341,670 | B2 | 5/2016 | Bartley et al. | |
| 9,459,285 | B2 | 10/2016 | Ma | |
| 9,488,690 | B2 | 11/2016 | Bartley et al. | |
| 9,739,825 | B2 | 8/2017 | Bartley et al. | |
| 2004/0140825 | A1 | 7/2004 | Zemer et al. | |
| 2005/0083038 | A1 | 4/2005 | Rothaug et al. | |
| 2006/0006891 | A1 | 1/2006 | Romanov et al. | |
| 2007/0001693 | A1 | 1/2007 | Romanov | |
| 2007/0216434 | A1 | 9/2007 | Korson et al. | |
| 2015/0015288 | A1 | 1/2015 | Ma | |
| 2015/0047892 | A1 | 2/2015 | Yang et al. | |
| 2015/0338457 | A1 | 11/2015 | Bartley et al. | |
| 2015/0342057 | A1 * | 11/2015 | Bartley | H05K 3/429 408/2 |
| 2021/0131902 | A1 * | 5/2021 | Jourdan | G01M 3/205 |

FOREIGN PATENT DOCUMENTS

| | | |
|---|---|---|
| CN | 102788888 A | 11/2012 |
| CN | 205103284 U | 3/2016 |
| EP | 0 551 564 A2 | 7/1993 |
| JP | H05-264672 A | 10/1993 |
| JP | 2003-185695 A | 7/2003 |
| JP | 2006-525497 A | 11/2006 |
| JP | 2007-278820 A | 10/2007 |
| JP | 2007278820 | 10/2007 |
| JP | 2012-021804 A | 2/2012 |
| WO | WO 03048787 A1 | 6/2003 |
| WO | WO03096037 A1 | 11/2003 |
| WO | WO 2014140029 A1 | 9/2014 |

OTHER PUBLICATIONS

German Search Report, from German Application No. 10 2018 101 031.1, filed on Jan. 18, 2018. 8 pages.
International Search Report dated Apr. 18, 2019, from International Application No. PCT/EP2019/051148, filed on Jan. 17, 2019. 7 pages.
Lee, N.K.S., et al. "Design of precision measurement system for metallic hole," The International Journal of Advanced Manufacturing Technology, 44 (5-6): 539-547 (2009).
Written Opinion dated Apr. 18, 2019, from International Application No. PCT/EP2019/051148, filed on Jan. 17, 2019. 8 pages.
Taiwanese Examination Report dated Oct. 1, 2019 from Taiwanese Application 108101944. 13 pages.

* cited by examiner

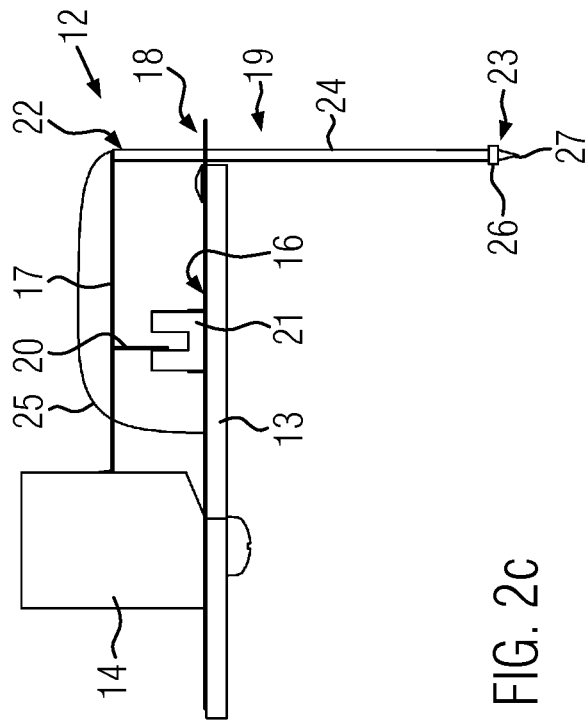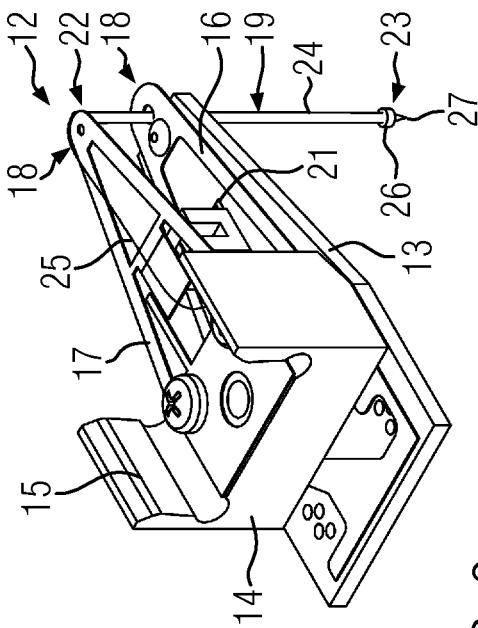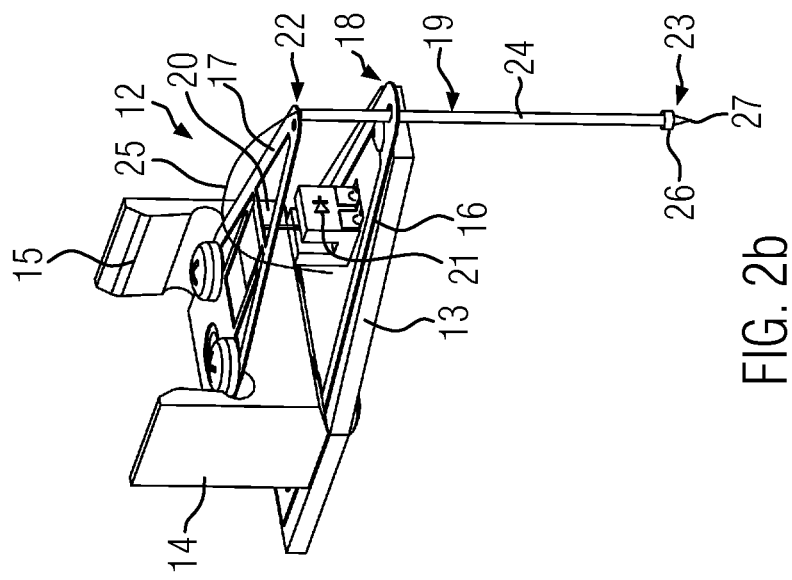

CAPACITIVE TEST NEEDLE FOR MEASURING ELECTRICALLY CONDUCTIVE LAYERS IN PRINTED CIRCUIT BOARD HOLES

RELATED APPLICATIONS

This application is a § 371 National Phase Application of International Application No. PCT/EP2019/051148, filed on Jan. 17, 2019, now International Publication No. WO 2019/141777, published on Jul. 25, 2019, which International Application claims priority to German Application 10 2018 125 666.3 filed Oct. 16, 2018 and German Application 10 2018 101 031.1 filed Jan. 18, 2018, all of which are incorporated herein by reference in their entirety.

The present invention relates to a test needle for measuring electrically conductive layers in holes of printed circuit boards, as well as to a test probe with such a test needle and to a flying probe tester for testing printed circuit boards with such a test needle or with such a test probe.

When printed circuit boards are manufactured, the printed circuit boards are often initially produced with so-called coupons. The coupons are regions of the printed circuit board that have predetermined conductor tracks in order to permit measurements to be performed on them. After the measurements have been performed to test whether the printed circuit board has been properly manufactured, the coupons are separated from the rest of the printed circuit board. The rest of the printed circuit board comprises one or more so-called use areas or panels, which are equipped with electrical components and are used in electrical products.

On the coupons, different electrical properties can be measured. The coupons have special conductor tracks, in which it can be easily determined whether the production process has, for example, met requirements for the manufacture of high-frequency-suitable conductor tracks. The conductor tracks of the coupon can also be used for performing load tests, which can also destroy individual conductor tracks on the coupons. Since the conductor tracks of the coupons are not used in subsequent products, they can be especially optimized for certain testing procedures.

But not all measurements on the coupons can be transferred to the conductor tracks of a use area. For one thing, the conductor tracks in the use area often have a different geometry from the ones on the coupon so that the transfer of measurement results in the coupon is not always applicable to the conductor tracks of the use area.

For a long time, there have also been measurement probes for applying high-frequency signals to conductor tracks of the use area in order to test their high-frequency properties. Such a high-frequency measurement can only be reliably performed if the contacting of the conductor track occurs in an electrically adapted way. If reflections are produced, then it is difficult to identify the actual location of the defect. In addition, a high-frequency measurement always requires a ground reference point close to the contact point. The design of a corresponding measuring head is therefore costly.

To measure the electrically conductive layer in back-drilled holes, a corresponding testing head with a conductive elastomer is known from U.S. Pat. No. 9,459,285 B2, which can mechanically sense and electrically measure the conductive layers.

It is also known from U.S. Pat. No. 8,431,834 B2 to provide a printed circuit board with an additional conductor track so that an impedance measurement between this additional conductor track and the actual conductor track can be used to verify whether the back-boring has been made deep enough or has gone too deep. It is very expensive to provide an additional conductor track of this kind and significantly increases the costs of a multilayer printed circuit board.

US 2015/047892 A1 has disclosed a method in which a drill is simultaneously used as a probe in order to be able to measure the electrical contact with the conductor track during the back-boring and to thus control the drill accordingly.

The U.S. Pat. No. 9,341,670 B2, U.S. Pat. No. 9,488,690 B2, and U.S. Pat. No. 9,739,825 B2 have disclosed methods and devices that can be used to measure so-called "stubs" in holes of a printed circuit board. Such stubs are remainders or stumps of an electrically conductive layer in a hole of the printed circuit board, which are in general electrically connected to a conductor track. In order to remove such stubs, holes of a printed circuit board are often drilled a second time, which is referred to as back drilling. This back drilling can remove these stubs that have been inadvertently produced during the coating of the individual layers with the electrically conductive layer, which is generally a copper layer. This back drilling, however, can also break desired electrical connections of the conductor track. This device has a capacitive probe, which is inserted into a back-drilled hole of a printed circuit board. The capacitance of the capacitive probe is measured. Other electrically conductive material that is present in the back-drilled hole is detected by the capacitance. It is thus possible to detect defects in the back drilling.

The object underlying the present invention is to create a test needle for measuring electrically conductive layers in holes of printed circuit boards as well as a corresponding test probe and a flying probe tester, which can easily, reliably, and very precisely measure a back-drilled hole of a printed circuit board according to the method described in U.S. Pat. No. 9,341,670 B2.

The object is attained by the subjects of the independent claims. Advantageous embodiments of the invention are disclosed in the respective dependent claims.

A test needle according to the invention for measuring electrically conductive layers in holes of printed circuit boards comprises an electrical conductor, which is enclosed by a shield; the test needle has a connecting end at which it can be electrically connected to a capacitive measuring device and a measuring end that can be inserted into a hole during a measurement.

This test needle features the fact that at the measuring end, a capacitive measuring body that is connected to the electrical conductor is positioned outside of the shield and can form a capacitive coupling with an electrically conductive layer in the hole.

Because the electrical conductor of the test needle is shielded and only the capacitive measuring body can form a capacitive coupling with another electrically conductive body, the test needle can very precisely detect the location of the capacitive measuring body based on the measured capacitance in relation to an electrically conductive layer.

The measuring body is preferably enclosed by an electrical insulation layer so that no electrical contact can occur between the measuring body and another electrically conductive body.

The measuring body can be embodied in the form of a hollow cylinder.

The measuring body can also be embodied by means of one or more windings of the electrical conductor, with these windings being situated outside the shield.

The measuring body preferably has a maximum diameter of 1.5 mm, in particular a maximum diameter of 1 mm, and preferably a maximum diameter of 0.75 mm.

In the axial direction of the test needle, the measuring body preferably has a maximum length of 0.5 mm, preferably a maximum length of 0.25 mm, and in particular a maximum length of 0.15 mm.

The smaller the measuring body is embodied to be, the more precise the local resolution that can be detected with the test needle.

On the other hand, the greater the area over which the measuring body extends, the greater the capacitive coupling to an electrically conductive layer in the hole and the more powerful the measured signal. In order to detect an electrically conductive layer, a compromise must be struck between the local resolution and the capacitive coupling.

The test needle can have an electrically conductive tube, which forms the shield, in which a cable—which includes the electrical conductor and an electrical insulation layer—is guided. The cable can protrude a short distance from the tube at the connecting end in order to be connected to the capacitive measuring device. At the measuring end, the cable can protrude a short distance in order to be placed around the tube so as to form the measuring body in one or more windings. This is a very simple design of the test needle, but nevertheless enables very precise measurements. Preferably, the cable is wound with two, three, four, or more windings around the electrically conductive tube to produce the measuring body.

A test probe for measuring electrically conductive layers in holes of printed circuit boards can be provided with an above-described test needle and has a touch sensor with which it is possible to determine whether the test needle is touching another body.

The touch sensor can be used to measure the depth of a blind hole in that the test probe first touches the surface of the printed circuit board that is to be tested and then touches a bottom of the blind hole; the touches are each detected and in so doing, detects the position of the test probe. The difference between the two positions yields the depth of the blind hole.

The actual capacitive measurement should be as contactless as possible, which is why the touch sensor can also be used to try to determine whether another body is being touched in order to then if necessary, move the test needle so that it is no longer touching the body.

The touch sensor can have a spring-elastic mount for holding the test needle and a sensor for detecting a deflection of the spring-elastic mount.

The sensor for detecting a deflection of the spring-elastic mount can be an optical sensor. This optical sensor can be embodied in different ways. A light source can be positioned, for example, on the spring-elastic mount directly or indirectly by means of optical fiber, with the light output being detected by means of an optical sensor. When the spring-elastic mount is deflected, the cone of light is moved away from the optical sensor, which is detectable due to a change in brightness. It is likewise possible to provide a photoelectric beam.

On the test probe, a stop can be provided against which the test needle and/or the spring-elastic mount rest(s) in the non-deflected state. The position of the test needle in the non-deflected state is thus clearly defined in relation to the test probe. If the position of the test probe is known, then based on this, it is also possible to extrapolate the position of the test needle and thus the position of the measuring body.

A flying probe tester for testing printed circuit boards, particularly for testing bare printed circuit boards, preferably has a test finger, which is able to move freely in a predetermined testing region in order to be able to be moved into the vicinity of a predetermined contact point of the printed circuit board. The test finger can be provided with an above-described test needle or with an above-described test probe.

The flying probe tester can have multiple test fingers, with one or more of the additional test fingers being embodied with a test needle for electrically contacting particular contact points of the printed circuit board.

According to another aspect, the invention relates to a method for measuring electrically conductive layers in holes of printed circuit boards. An above-described test needle or an above-described test probe or the above-described flying probe tester is used for this. The test needle with the capacitive measuring body is inserted into a hole. The location of the capacitive measuring body in this case is detected and at the same time, the electrical capacitance of the capacitive measuring body relative to its surroundings is measured. Based on the measured capacitance, a determination is made as to whether an electrical conductor is present in the vicinity of the detected location. Through the simultaneous detection of the location of the capacitive measuring body and the capacitance that is measured along with this, it is thus possible to determine the location of an electrical conductor. This capacitive measuring body can also be inserted into small holes so that electrically conductive layers embodied on the inner surface can be reliably detected.

In addition to the actual measurement of the capacitance, it is also possible to use the above-described touch sensor to determine the depth of a blind hole that is to be measured. This determination of the depth can be carried out before, during, or after the capacitive measurement.

In order to measure the capacitance, an electrical signal with a frequency of at least 1 kHz is applied. Higher frequencies of for example at least 2 kHz or at least 4 kHz can also be used. The measurement signal can be applied to the conductor of the test needle and thus to the capacitive measuring body. In a conductor track, which is to be connected to a segment of an electrical conductor that is to be measured, the measurement signal induced therein is sensed. Preferably, though, the measurement signal is applied to a conductor track, which is to be connected to the electrical conductor that is sensed with the capacitive measuring body. Then, the measurement signal of this electrical conductor is induced in the capacitive measuring body and can be correspondingly detected by the measuring device and evaluated. This is particularly advantageous if the electrical conductor is connected to many electrically conductive segments that are located in different holes. Then a test finger must be placed on this electrical conductor and the test probe can sense the electrical conductors in multiple holes one after another.

When determining whether an electrical conductor is located in the vicinity of the measuring body, a comparison to a capacitance profile of a properly embodied hole can be carried out. A "properly embodied hole" is a hole in which desired regions of the inner surface are provided with an electrically conductive layer and these regions are connected to the electrical conductor to which the measurement signal is applied while other regions of the inner surface of the hole are not provided with an electrically conductive layer. The position of the electrically conductive layer on the inner surface of the hole can thus be determined based on the comparison. If the measured capacitance profile matches the predetermined capacitance profile, then the hole is properly embodied, i.e. an electrically conductive layer is provided only in the desired places. But if there are deviations, then this means either that an electrically conductive layer is missing at a particular place or that an electrically conductive layer is provided, in which no electrically conductive layer should be present.

With this method, the test needle is always kept as perpendicular as possible to the surface of the printed circuit board to be tested since as a rule, the holes are produced perpendicular to the surface of the printed circuit board. The test needle is thus axially aligned with the respective hole and the risk of a collision with the inner surface of a hole is slight.

Figure 3:
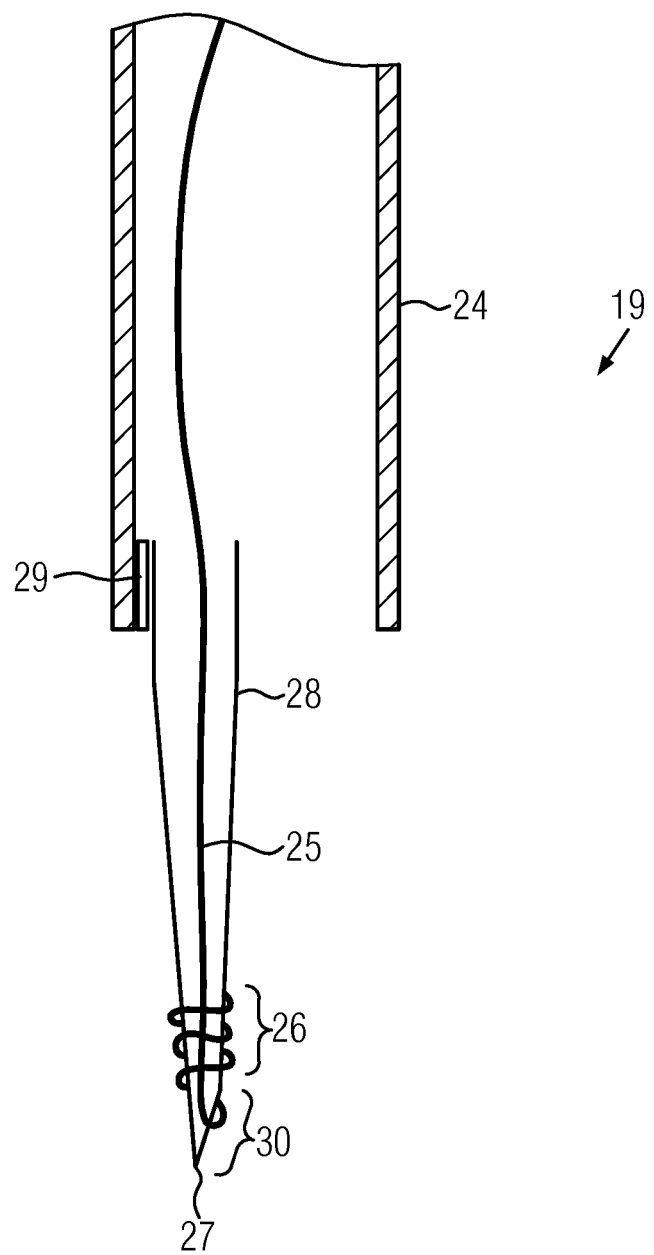
Figure 4:
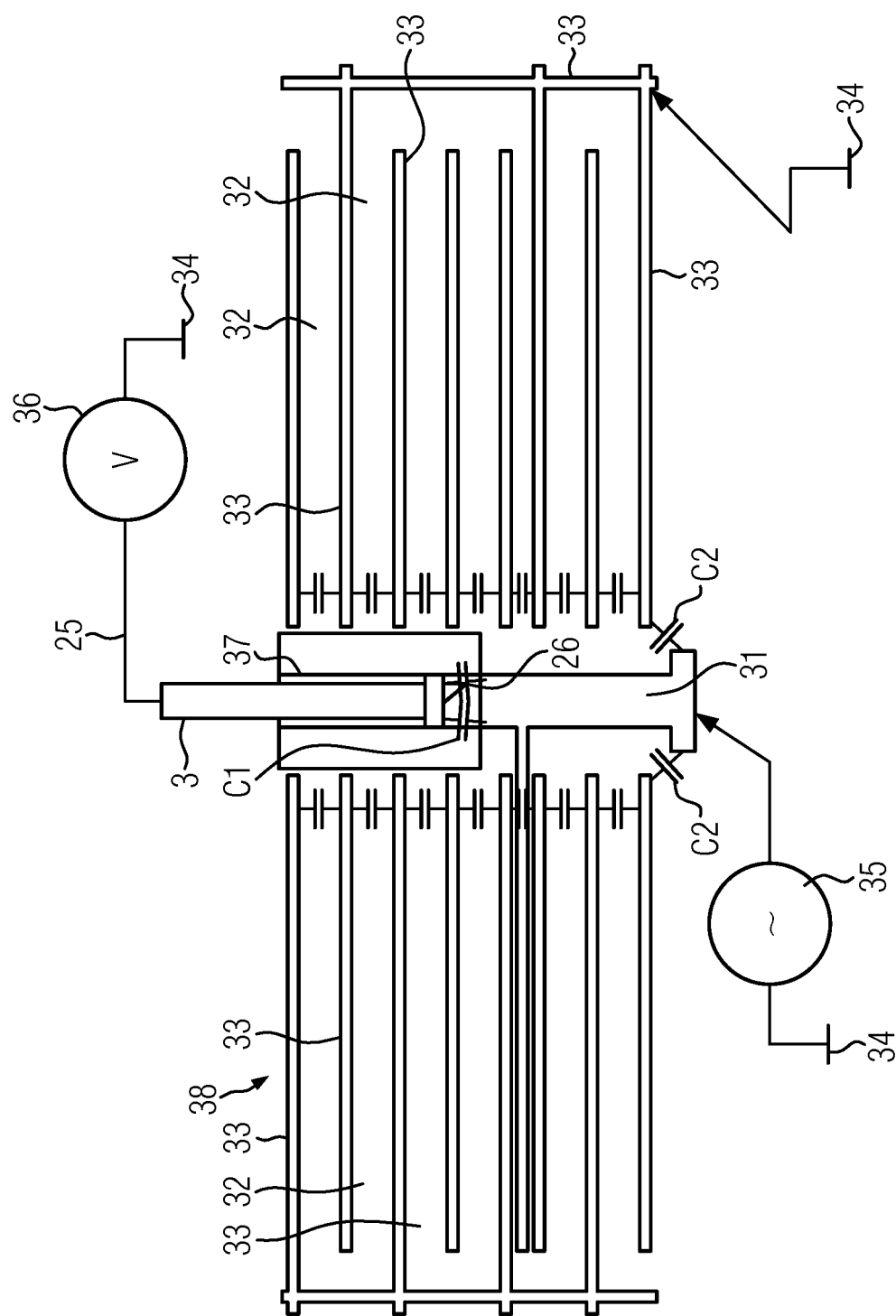
Figure 5:
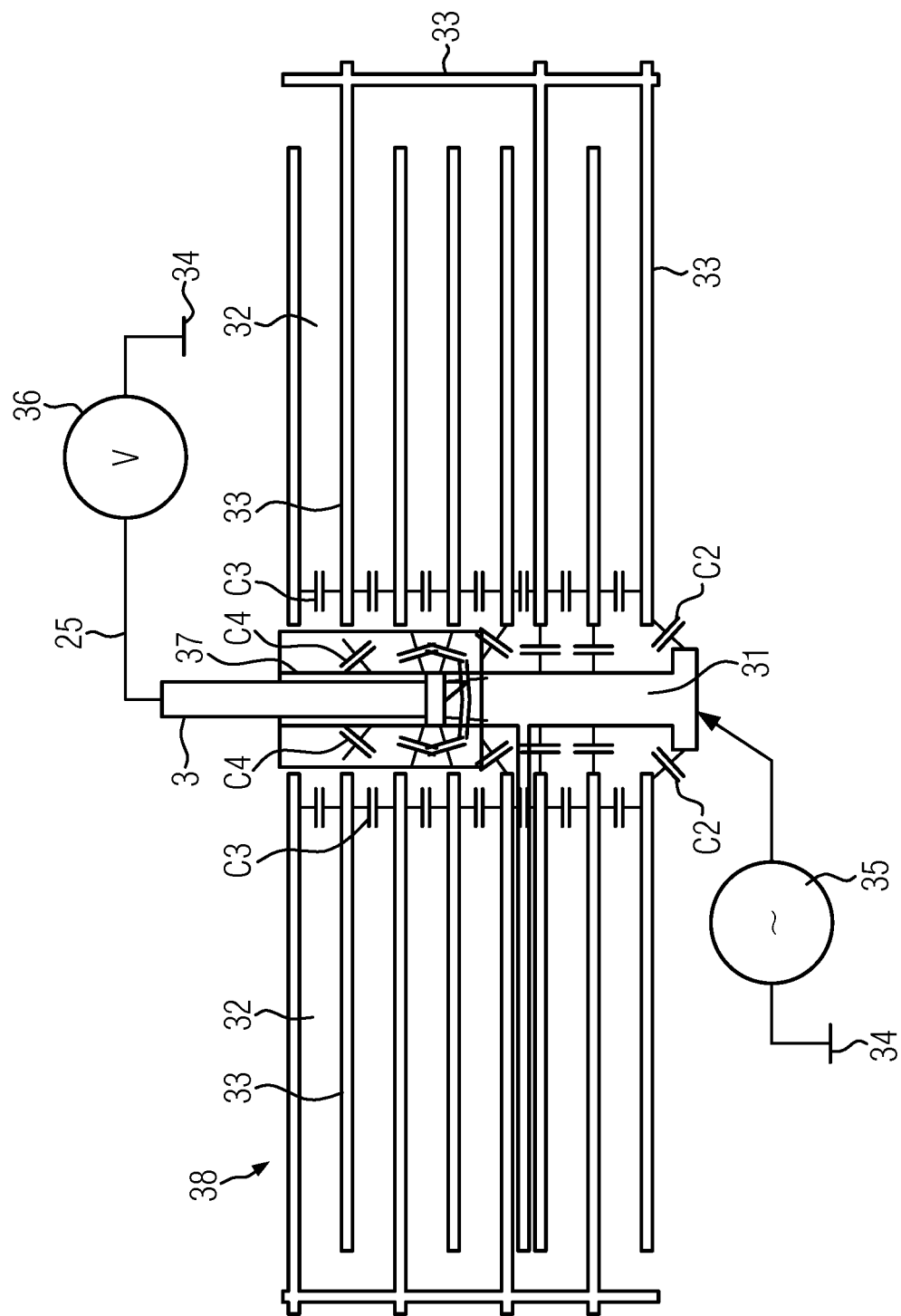
Figure 6:
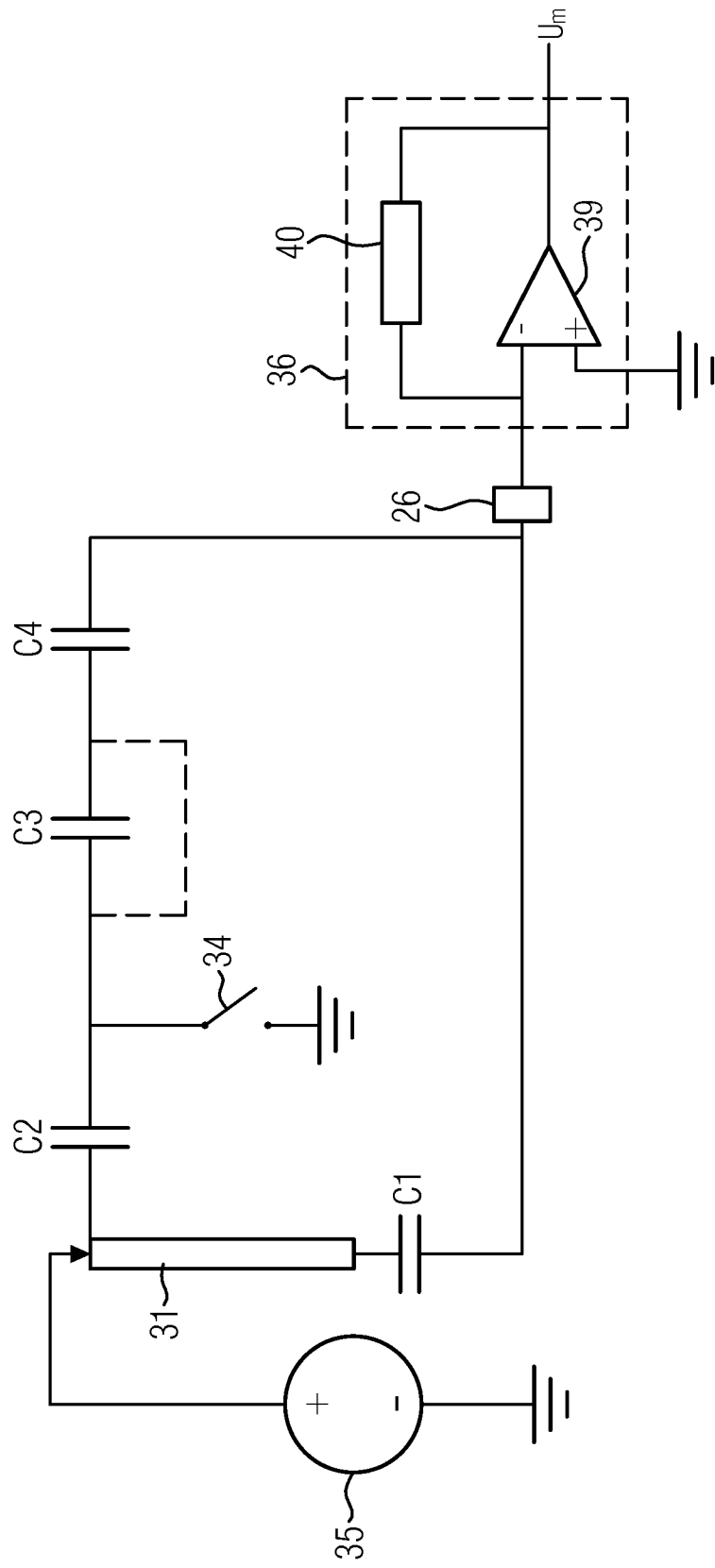

The invention will be explained in greater detail below based on an exemplary embodiment that is shown in the drawings. In the schematic drawings:

FIG. 1 shows a perspective view of a flying probe tester,

FIGS. 2a-2c show perspective views and a side view of a test probe with a test needle according to the invention, FIG. 3 shows a cross-sectional view of a detail of a test needle with a testing tip, FIG. 4 schematically depicts a measuring device for measuring an electrically conductive layer in a plated through-hole of a printed circuit board, with the printed circuit board depicted in cross-section and with the ground conductor track connected to electrical ground, FIG. 5 schematically depicts a measuring device for measuring an electrically conductive layer in a plated through-hole of a printed circuit board, with the printed circuit board depicted in cross-section and with the ground conductor track not connected to electrical ground, and FIG. 6 shows an equivalent circuit diagram of measuring devices for contactless measurement of the conductive layer in a plated through-hole according to FIGS. 4 and 5.

The invention can be embodied by means of a flying probe tester 1, which has multiple test fingers 2, which are each provided with a test probe 3 with which a printed circuit board 4 to be tested can be electrically contacted in order to feed in or sense a corresponding measurement signal in the conductor tracks (FIG. 1).

Test probes 3 of this kind are described, for example, in WO 03/048787 A1, to which reference is made in this regard.

In the present exemplary embodiment, the flying probe tester has two transverse units 5 on which a plurality of guide rails 6 are positioned, which extend across a testing region that can accommodate the printed circuit board 4 that is to be tested. Each transverse unit 5 forms a frame with an oblong through opening. The two transverse units 5 stand vertically on a support 7 so that their through openings are flush with each other. The testing region for accommodating the printed circuit board 4 extends through the through openings of the transverse units 5. In the present exemplary embodiment, each transverse unit has four guide rails 6, two on each side of the transverse unit 5. On each side of the transverse unit, one of the guide rails 6 is positioned above the through opening 8 and the other of the guide rails is positioned below it.

Each guide rail 6 has at least one slider 9 positioned on it in sliding fashion, each of which supports one of the test fingers 2. In the present exemplary embodiment, two sliders 9 are provided on each guide rail 6. Basically, though, more than two sliders 9 can also be provided on a guide rail 6.

The test fingers 2 are fastened in pivoting fashion to the sliders 9 at one end. Such a design of a flying probe tester can be inferred, for example, from WO 2014/140029 A1. In this regard, reference is made to this document in its entirety.

The test probes 3 are positioned at the ends oriented away from the sliders 9, i.e. the free ends of the test fingers 2, and each have a test needle 10, which is oriented with a contact tip 11 in the direction of the printed circuit board 4 that is to be contacted. The test fingers 2 can be moved with the test probes 3 in the directions toward the printed circuit board 4 and away from the printed circuit board 4 in order to position the contact tip 11 either on the surface of the printed circuit board or insert it into a hole in the printed circuit board 4.

According to the invention, at least one or several of the test fingers 2 has/have a respective test probe 12 (FIGS. 2a-2c), which is embodied for contactless capacitive sensing of holes and in particular blind holes in the printed circuit board 4. Such a test probe 12 has a base plate 13, which is embodied as a printed circuit board. The base plate 13 is provided with a detent body 14, which has two detent arms 15 with which the test probe 12 can be affixed to one of the test fingers 2 in detent fashion. Two spring arms 16, 17 are fastened to the detent body 14. One of the two spring arms rests directly against the base plate 13 and is clamped between the base plate 13 and the detent body 14. The other spring arm 17 is fastened by means of two screws to the surface of the detent body 14 facing away from the base plate 13. The spring arms 16, 17 are oriented parallel to one another. Viewed from above, starting from the detent body 14, the base plate 13 and the spring arms 16, 17 taper to a free end 18 at which the two spring arms 16, 17 each protrude a short distance. At these ends of the spring arms 16, 17, a respective test needle 19 is fastened so that the elastic spring arms 16, 17, the detent body 14, and the segment of the test needle 19, which joins the two spring arms 16, 17, form a parallelogram. The free ends of the two spring arms 16, 17 can be pivoted away from the base plate 13 so that the test needle is supported on the test probe 12 in an elastic way. The spring arm 16 resting directly on the base plate is referred to below as the base spring arm 16 and the spring arm 17 that is remote from the base plate 13 is referred to as the free spring arm 17. The base plate 13 thus constitutes a stop for the base spring arm 16 and thus for the movement of the test needle 19 relative to the rest of the body of the test probe 12.

Viewed from above, the two spring arms 16, 17 form an approximately triangular frame. A measuring tag 20 pointing toward the base plate 13 is positioned on the free spring arm 17. On the base plate 13, a photoelectric beam device 21 is provided, which, with a light source and a light sensor, forms a photoelectric beam that the measuring tag 20 interrupts when the spring arms 16, 17 are not deflected. When the spring arms are deflected, the measuring tag 20 is moved out of the photoelectric beam so that the light sensor detects an increased brightness. This photoelectric beam device 21, together with the measuring tag 20 thus forms a touch sensor, which detects when the spring arms 16, 17 are deflected because the test needle 19 is touching another body.

The test needle has a connecting end 22 and a measuring end 23. In the region of the connecting end 22, the free spring arm 17 is connected to the test needle 19. The test needle 19 is connected to the base spring arm 16 so that in the non-deflected state of the spring arms 16, 17, i.e. when the base spring arm 16 is resting against the base plate 13, the test needle 19 is positioned perpendicular to the plane of the base plate 13.

This test probe 12 and the corresponding test finger 2 are embodied so that when mounted on the test finger 2, in the non-deflected state, the test needle is positioned perpendicular to the testing region and to a printed circuit board 4 that is positioned in the testing region.

The test needle 19 on the test probe 12 protrudes a short distance relative to the base plate 13. The test needle 19 has a metal tube, which is electrically conductive and preferably has an outer diameter of at most 0.2 mm and in particular at most 0.18 mm. A cable 25 is guided in the metal tube 24 and has an electrical conductor, which is encompassed by an insulation layer. In the present exemplary embodiment, the cable 25 is connected to a conductor track, which is embodied on the base plate 13 and is electrically connected to a capacitive measuring device (not shown). At the measuring end 23, the conductor of the cable 25 is connected to a capacitive measuring body 26. The capacitive measuring body is a metallic annular body that is positioned around the tube and is electrically insulated from it. The capacitive measuring body 26 can be a metal ring provided with an insulation layer, which is electrically connected to the conductor of the cable 25. The capacitive measuring body 26, however, can also be composed of one or more windings of the cable 25.

The metal tube 24 serves to shield the cable 25 so that only the capacitive measuring body 26 can form a capacitive coupling with an electrical conductor located in the vicinity and only its capacitive coupling to this other electrical conductor can be sensed by means of the cable 25.

At the measuring end 23 of the test needle 19, a measuring tip 27 is provided. This measuring tip is used only for mechanically touching another body. The measuring tip can be composed of an electrically non-conductive material or can be provided with an insulation layer. In the present exemplary embodiment, it is not used for electrically contacting a contact point of a printed circuit board.

In the context of the invention, however, the measuring tip can also be embodied as electrically conductive so that it can be used for producing an electrical connection to a contact point of the printed circuit board. If such an electrically conductive contact tip is electrically connected to the capacitive measuring body 26, then the contact tip can be also be taken into account in a capacitive coupling that the capacitive measuring body 26 forms with an electrically conductive article that is to be measured.

An exemplary embodiment of the measuring tip 27 is composed of a cannula tube 28, one end of which is mechanically connected in an electrically conductive way to the tube or shield 24 by means of a soldered connection 29. In the region of the soldered connection 29, the cannula tube has a diameter of for example 0.3 mm. The cannula tube is oriented axially in the direction of the measuring tip 27 and in the region of the measuring tip 27, has a diameter of 0.2 mm or less. In the region of the measuring tip, the cannula tube 28 is cut in an inclined fashion, yielding an outlet opening 30 that extends in an inclined fashion.

The cable 25 is guided through the tube 24 and the cannula tube 28 and exits the cannula tube 28 at the outlet opening 30. In the region of the measuring tip 27, the cable is wound with three windings around the cannula tube 28 and forms the capacitive measuring body 26.

The measuring tip 27 itself is electrically conductive and connected to the tube 24 in an electrically conductive way.

Such a measuring tip embodied in an electrically conductive fashion has the advantage that the test needle 19 can, for example, come into contact with a calibration surface, which has electrically conductive and electrically non-conductive surface sections so that it is possible to calibrate the position of the test needle 19 and thus the position of a test finger 2 in which the test needle 19 is fastened.

The test needle 19 shown in FIG. 3 is easy to produce and has a very small measuring body 26 so that the local resolution is correspondingly precise.

A typical measuring procedure for measuring the electrically conductive coating in a blind hole of a printed circuit board by means of the flying probe tester 1 is carried out as follows:

A test finger 2, which the test probe 12 according to the invention has, mechanically contacts the surface of the printed circuit board 4, which is to be tested, in order to determine its height.

The test probe with the test needle is inserted into a blind hole, which belongs to the printed circuit board 4 and is to be measured, until the measuring tip 27 touches the bottom of the blind hole of the printed circuit board 4. The location of the test probe 12 at the time when the bottom of the blind hole is touched is detected by means of the touch sensor so that the depth of the blind hole is determined based on the height difference between this location and the location at which the test probe or more precisely, its measuring tip 27, has touched the surface of the printed circuit board.

With the capacitive measuring body 26 positioned in the blind hole, a capacitive measurement of the capacitance between the capacitive measuring body 26 and an electrical conductor positioned in the blind hole is performed in that by means of another test finger 2, which contacts a contact point of the printed circuit board that is connected to this electrical conductor, a predetermined measurement signal is applied to this electrical conductor. The measurement signal preferably has a frequency of at least 1 kHz and in particular, a frequency of at least 4 kHz or at least 10 kHz.

The signal that is induced by means of this in the capacitive measuring body 26 is sensed by the capacitive measuring body 26 via the cable 25 and is relayed to the measuring device. The amplitude of the signal that is measured in this way is used to determine the capacitance that is produced between the capacitive measuring body 26 and the electrical conductor that is adjacent to it. At the same time, the location of the capacitive measuring body 26 is detected, which is predetermined by the location of the test probe 12 that is set by means of the movement of the corresponding test finger 2 and is known on the flying probe tester 1. Through the simultaneous detection of the location and capacitance during the movement of the capacitive measuring body 26 in the blind hole, it is possible to make a location-dependent determination of the capacitance that the capacitive measuring body 26 assumes relative to its surroundings. This produces a profile of the capacitance based on which it is possible to extrapolate whether the inner surface of the blind hole is coated with an electrical conductor.

Preferably, the flying probe tester 1 has multiple test fingers 2, which are each provided with a test probe 12 according to the invention. By means of this, multiple blind holes or through holes can be measured at the same time. Preferably, during the simultaneous measurement, measurement signals are used that differ in terms of their frequency. It is thus possible with corresponding band-pass filters to prevent crosstalk from one measurement onto another measurement.

Preferably, each guide rail 6 is provided with at least one test finger 2 with a test probe 3 equipped with a conventional test needle 10 for electrically contacting a contact point of the printed circuit board and is provided with another test finger 2 with a test probe 12 according to the invention. It can also be advantageous to provide a guide rail 6 with two test fingers 2 with conventional test probes 3 and another test finger 2 equipped with a test probe 12 according to the invention.

The invention can, however, also be used on a conventional flying probe tester, which has a plurality of separate transverse beams that are not positioned on a combined transverse unit 5. In a flying probe tester of this kind, it is in turn advantageous to provide each transverse beam with at least on test finger 2 with a test probe 12 according to the invention and one or more test fingers with conventional test probes 3.

With the test probe according to the invention, it is thus very easily possible to precisely determine the geometry of a blind hole or a through hole and on the other hand, to determine whether the inner surface of the blind hole or through hole is coated with an electrical conductor.

Furthermore, the test probe 12 according to the invention can be used in conventional flying probe testers. No other mechanical modifications are required. The flying probe tester only has to be provided with a suitable control program, which is able to process the measurement signals generated by the test probe 12 according to the invention, to apply suitable measurement signals, and to control the movement of a test finger 2 with the test probe 12 according to the invention.

A method for measuring a plated through-hole 31 in a hole 37 of a printed circuit board 38 will be explained below. The plated through-hole 31 is an electrically conductive coating on the inner surface of the hole. When the printed circuit board 38 is produced, the entire hole is initially coated. Then the hole is back drilled a second time to such a depth that in a predetermined segment, the coating of the hole 37 is removed again. In this connection, errors can occur when the back drilling has been carried out in such a way that it is not deep enough or is too deep so that the rim of the coating in the hole is offset a little bit relative to its desired position. The second hole can also be offset by a little relative to the first hole so that the two holes are not concentric. As a result, a thin, unwanted stripe in the coating can remain in the region of the hole. The stripe extends in a direction approximately parallel to the central axis of the hole. Such a stripe can also be produced if the second hole is embodied as inclined somewhat relative to the first hole.

The printed circuit board 38 has multiple layers 32 between which conductor tracks 33 are embodied. There are larger and smaller conductor tracks. As a rule, the so-called ground conductor track is the largest conductor track of a printed circuit board and can often extend across multiple layers 32. In the measuring method described below, the ground conductor track is connected to electrical ground 34 (FIG. 4). Instead of individual ground conductor tracks, it is also possible for multiple individual smaller conductor tracks to be used, which are simultaneously connected to electrical ground 34. In the description that follows, the term "ground conductor track" is used to describe one or more conductor tracks, which can be simultaneously connected to electrical ground and branch out across a large region of the printed circuit board 38, in particular across several layers. This connection to electrical ground 34 is preferably produced by placing a moving contact finger of the flying probe tester against the conductor track, this contact finger having an electrically conductive contact tip, which is connected to electrical ground.

When the test probe 3 is inserted into the hole, the capacitive measuring body 26 forms an electrical capacitance with the surrounding electrical conductors. The goal of this method is to measure this capacitance or more precisely, its change when the capacitive measuring body is inserted into the hole.

To this end, a signal generator 35 is used to apply an oscillation signal relative to the electrical ground to the plated through-hole 31. This measurement signal flows along the plated through-hole 31, via a capacitance C1 between the plated through-hole 31 and the capacitive measuring body 26, into the capacitive measuring body 26 and from there, via the cable 25 to a current-measuring device 36 with which the voltage and thus the capacitance C1 or more precisely, its capacitance change, are measured when the capacitive measuring body 26 travels into the vicinity of the plated through-hole 31.

Between the plated through-hole 31 and the adjacent conductor tracks, a parasitic capacitance C2 is produced. This is primarily relevant when it is produced between the plated through-hole and the ground conductor track. If the ground conductor track were not grounded, then the parasitic capacitance would cause the measurement signal on other conductor tracks to be transmitted to the ground conductor track via the capacitive coupling (capacitance C3). As a result, with the capacitive measuring body, the measurement signal would be observed via other capacitive couplings (capacitance C4) between the capacitive measuring body 26 and the conductor tracks situated outside the plated through-hole (FIG. 5). As a result, it would no longer be possible to precisely determine whether one was measuring the electrical capacitance C1 between the measuring body 26 and the plated through-hole 31 or the capacitance C4 between the measuring body 26 and one of the other conductor tracks.

The functionality of the measuring device from FIGS. 4 and 5 will be explained below based on an equivalent circuit diagram (FIG. 6). This equivalent circuit diagram comprises the following elements:

26 measuring body
31 plated through-hole
34 electrical ground (=grounding finger, switchable)
35 signal generator
36 current-measuring device The capacitor C1 is the coupling between the plated through-hole 31 and the measuring body 26.

The capacitor C2 is positioned between the plated through-hole 31 and the ground conductor track as defined by the above description. The capacitor C3 is the coupling between the ground conductor track and the other conductor tracks. The capacitor C4 is the coupling of the conductor tracks with the measuring body 26. The coupling of the conductor tracks to the measuring body 26 can take place directly by means of the ground conductor track or by means of the capacitance C3 of other conductor tracks that are coupled to the ground conductor track. If the coupling is produced between the ground conductor track and the measuring body 26 directly, then the capacitor C3 is eliminated, which is why it is short-circuited with a dashed line in the equivalent circuit diagram and does not have to be taken into account in the considerations below.

The connection 34 of the ground conductor track to the electrical ground is depicted with a switch in the equivalent circuit diagram (FIG. 6); in the measuring device according to FIG. 4, the switch is closed and in the measuring device according to FIG. 5, the switch is open.

If the ground conductor track is not connected to electrical ground (the switch at 34 in FIG. 6 is open), then the following is true:

The capacitors C2(, C3) and C4 are connected in parallel to the capacitor C1. If the series circuit composed of C2(, C3) and C4 is larger than C1, then the total capacitance between the plated through-hole 31 and the measuring body 26 is primarily determined by the series circuit of the capacitors C2(, C3) and C4 and the current measured by the current-measuring device 36 is primarily determined by the series circuit composed of C2(, C3) and C4.

If the ground conductor track is connected to electrical ground (the switch at 34 in FIG. 6 is closed), then the connection between C2 and C3 is connected to electrical ground.

The current-measuring device 36 is a current-to-voltage converter, which has an operation amplifier 39 and a measurement resistor 40. For example, the operation amplifier is of the AD549 type. At the output of the current-measuring device 36, a voltage signal Um is present, which is proportional to the current flowing at the input of the current-measuring device.

An input of the operation amplifier is connected to the measuring body 26 while the other input is connected to electrical ground. A feedback of the input side and output side of the operation amplifier via the measurement resistor 40 keeps the two inputs of the operation amplifier 39 at the potential of electrical ground.

The capacitors C3 and C4 are thus positioned between two points, which are each at the potential of electrical ground so that no current flows through them. They are thus not visible in the measurement.

The voltage signal of the signal generator 35 is present on one side of the capacitor C2 and the other side of the capacitor C2 is connected to electrical ground so that a current flows through this capacitor. This current is not measured by the measuring device since it flows out directly to electrical ground. This current influences the power output by the signal generator 35, but not the voltage output by the signal generator 35. Since the voltage signal U that is present at the capacitor C1 and the current I that is flowing through the capacitor are known, they can be used to determine the capacitance of the capacitor C1 without the measurement being influenced by the other capacitances C2, C3, and C4 when the ground conductor track is connected to electrical ground.

As a result of this, by connecting the ground conductor track to electrical ground, the capacitive coupling C1 between the measuring body 26 and the plated through-hole 31 can be exactly measured; the amount of the capacitive coupling C1 can be determined and permits information to be gleaned about the geometric size of a defect in the plated through-hole.

This method is so precise that it can also be modified so that the signal of the signal generator can be applied to a single conductor track, which extends to the through hole so that based on this signal, the capacitive coupling of the measuring body to this conductor track can be detected. By means of this, the position of the measuring body in the through hole can be determined and it can be determined that this conductor track is correctly conducting the measurement signal to the region of the plated through-hole.

Usually, the location of the test probe relative to the location of the printed circuit board to be tested is calibrated by bringing the contact tip of the test probe 12 into contact with the surface of the printed circuit board. This mechanical calibration can be replaced by an electrical calibration; when the electrical calibration is carried out, an oscillation signal is applied to a conductor track adjacent to the through hole, which signal is then detected by the test probe or more precisely, its measuring body.

This method can also be modified such that multiple measurement signals with different frequencies are applied to different conductor tracks and/or to the plated through-hole. The different frequencies are distinguished during the measurement. This can, for example, take place in that the current-measuring device 36 is preceded by a tunable band-pass filter, which can be respectively connected to a frequency band that respectively includes a frequency of one of the signals. By means of this, it is possible to detect multiple conductor tracks in the vicinity of a through hole, provided that they are not shielded by a plated through-hole.

| Reference Numeral List | |
|---|---|
| 1 | flying probe tester |
| 2 | test finger |
| 3 | test probe |
| 4 | printed circuit board |
| 5 | transverse unit |
| 6 | guide rail |
| 7 | support |
| 8 | through opening |
| 9 | slider |
| 10 | test needle |
| 11 | contact tip |
| 12 | test probe |
| 13 | base plate |
| 14 | detent body |
| 15 | detent arm |
| 16 | spring arm (base spring arm) |
| 17 | spring arm (free spring arm) |
| 18 | free end |
| 19 | test needle |
| 20 | measuring tag |
| 21 | photoelectric beam device |
| 22 | connecting end |
| 23 | measuring end |
| 24 | tube |
| 25 | cable |
| 26 | capacitive measuring body |
| 27 | measuring tip |
| 28 | cannula tube |
| 29 | soldered connection |
| 30 | outlet opening |
| 31 | plated through-hole |
| 32 | layer |
| 33 | conductor track |
| 34 | electrical ground |
| 35 | signal generator |
| 36 | current-measuring device |
| 37 | hole |
| 38 | printed circuit board |
| 39 | operation amplifier |
| 40 | measurement resistor |

The invention claimed is:

1. A test probe for measuring electrically conductive layers in holes of printed circuit boards, comprising:
   a test needle including
      an electrical conductor, which is enclosed by a shield;
      the test needle has a connecting end, at which it can be electrically connected to a capacitive measuring device, and a measuring end that can be inserted into a hole during a measurement, wherein at the measuring end, a capacitive measuring body that is connected to the electrical conductor is positioned outside of the shield and can form a capacitive coupling with an electrically conductive layer in the hole, and a touch sensor with which it is possible to determine whether the test needle is touching another body;

wherein the touch sensor has a spring-elastic mount for holding the test needle and a sensor for detecting a deflection of the spring-elastic mount.

2. The test probe according to claim 1, wherein the sensor for detecting a deflection of the spring-elastic mount is an optical sensor.

3. The test probe according to claim 1, wherein on the test probe, a stop is provided against which the test needle and/or the spring-elastic mount rest(s) in the non-deflected state.

4. The test probe according to claim 1, wherein the measuring body is enclosed by an electrical insulation layer.

5. The test probe according to claim 1 wherein the measuring body is embodied by means of one or more windings of the electrical conductor and these windings are situated outside the shield.

6. The test probe according to claim 1, wherein the test needle has an electrically conductive tube, which forms the shield, in which a cable, which includes the electrical conductor and an electrical insulation layer, is guided and at the measuring end, the cable protrudes a short distance from the tube at the connecting end in order to be connected to the capacitive measuring device and protrudes a short distance at the measuring end so as to form the measuring body in one or more windings around the tube.

7. The test probe according to claim 6, wherein in the region of a measuring tip, the electrically conductive tube is cut in an inclined fashion so that in the axial direction of the tube, an outlet opening is produced that extends in an inclined fashion, with the cable being routed through the outlet opening.

8. A test probe for measuring electrically conductive layers in holes of printed circuit boards, comprising:

a test needle including an electrical conductor, which is enclosed by a shield;

the test needle has a connecting end, at which it can be electrically connected to a capacitive measuring device, and a measuring end that can be inserted into a hole during a measurement, wherein at the measuring end, a capacitive measuring body that is connected to the electrical conductor is positioned outside of the shield and can form a capacitive coupling with an electrically conductive layer in the hole, and a touch sensor with which it is possible to determine whether the test needle is touching another body;

wherein the measuring body is embodied in the form of a hollow cylinder.

\* \* \* \* \*